United States Patent
Kawahashi et al.

(10) Patent No.: US 7,879,705 B2
(45) Date of Patent: Feb. 1, 2011

(54) SEMICONDUCTOR DEVICES AND MANUFACTURING METHOD THEREOF

(75) Inventors: Akira Kawahashi, Komaki (JP); Masahiro Sugimoto, Toyota (JP); Akinori Seki, Shizuoka (JP); Masakatsu Maeda, Suita (JP); Yasuo Takahashi, Suita (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 128 days.

(21) Appl. No.: 12/440,939

(22) PCT Filed: Sep. 21, 2007

(86) PCT No.: PCT/JP2007/069135

§ 371 (c)(1),
(2), (4) Date: Mar. 12, 2009

(87) PCT Pub. No.: WO2008/035822

PCT Pub. Date: Mar. 27, 2008

(65) Prior Publication Data

US 2009/0233435 A1     Sep. 17, 2009

(30) Foreign Application Priority Data

Sep. 22, 2006  (JP) .............................. 2006-256705
Sep. 22, 2006  (JP) .............................. 2006-256706

(51) Int. Cl.
*H01L 21/28*   (2006.01)
*H01L 21/44*   (2006.01)

(52) U.S. Cl. ................. 438/571; 257/77; 257/E21.054; 257/E21.065; 438/582; 438/583; 438/586; 438/597; 438/931

(58) Field of Classification Search .................... 257/77, 257/E21.054, E21.065; 438/571, 582, 586, 438/597, 931

See application file for complete search history.

(56) References Cited

U.S. PATENT DOCUMENTS 6,884,644 B1    4/2005   Slater, Jr. et al.
2002/0179910 A1  12/2002  Slater, Jr.

FOREIGN PATENT DOCUMENTS

JP    2949699      7/1999
JP    2003-86534   3/2003
JP    2005-508087  3/2005

OTHER PUBLICATIONS

Crofton et al., Titanium and Aluminum—Titanium Ohmic Contacts to p—Type SiC., Solid State Electronics, vol. 41 (11), pp. 1725-1729 (1997).*

(Continued)

*Primary Examiner*—Asok K Sarkar
(74) *Attorney, Agent, or Firm*—Finnegan, Henderson, Farabow, Garrett & Dunner, LLP

(57) ABSTRACT

A method is set forth of forming an ohmic electrode having good characteristics on a SiC semiconductor layer. In the method, a Ti-layer and an Al-layer are formed on a surface of the SiC substrate. The SiC substrate having the Ti-layer and the Al-layer is maintained at a temperature that is higher than or equal to a first temperature and lower than a second temperature until all Ti in the Ti-layer has reacted with Al. The first temperature is the minimum temperature of a temperature zone at which the Ti reacts with the Al to form $Al_3Ti$, and the second temperature is the minimum temperature of a temperature zone at which the $Al_3Ti$ reacts with SiC to form $Ti_3SiC_2$. As a result of this maintaining of temperature step, an $Al_3Ti$-layer is formed on the surface of the SiC substrate. The method also comprises further heating the SiC substrate having the $Al_3Ti$-layer to a temperature that is higher than the second temperature. As a result of this step of further heating the SiC substrate reacts with $Al_3Ti$ of the $Al_3Ti$-layer to form a $Ti_3SiC_2$-layer on the surface of the SiC substrate.

9 Claims, 9 Drawing Sheets

OTHER PUBLICATIONS

J. Crofton et al., "Titanium and Aluminum-Titanium Ohmic Contacts to p-Type SiC," Sold-State Electronics, vol. 41, No. 11, pp. 1725-1729 (1997).

B. Johnson et al., "Mechanism of Ohmic Behavior of Al/Ti Contacts to *p*-Type 4H-SiC After Annealing," Journal of Applied Physics, vol. 95, No. 10, pp. 5616-5620 (2004).

G. Hui et al., "Ti-Al Based Ohmic Contacts to n-Type 6H-SiC with $P^+$ Ion Implantation," Chinese Physics, vol. 15, No. 9, pp. 2142-2145 (2006).

B. Pécz et al., "$Ti_3SiC_2$ Formed in Annealed Al/Ti Contacts to p-Type SiC," Applied Surface Science, vol. 206, pp. 8-11 (2003).

S. Tsukimoto et al., "Correlation Between the Electrical Properties and the Interfacial Microstructures of TiAl-Based Ohmic Contacts to p-Type 4H-SiC," Journal of Electronic Materials, vol. 33, No. 5, pp. 460-466.

M. Gao et al., "Role of Interface Layers and Localized States in TiAl-Based Ohmic Contacts to *p*-Type 4H-SiC," Journal of Electronic Materials, vol. 36, No. 4, pp. 277-284 (2007).

* cited by examiner

700°C

1000°C

SEMICONDUCTOR DEVICES AND MANUFACTURING METHOD THEREOF

CROSS-REFERENCE TO RELATED APPLICATIONS

The present application is a national phase application of International Application No. PCT/JP2007/069135, filed Sep. 21, 2007, and claims priority to Japanese Patent Applications 2006-256705 and 2006-256706 filed on Sep. 22, 2006, the contents of all of which are hereby incorporated by reference.

TECHNICAL FIELD

The present invention relates to a technique for forming an ohmic electrode on a SiC substrate, this electrode having low contact resistance with the SiC substrate.

BACKGROUND ART

SiC semiconductors have many of the characteristics required by semiconductor devices that operate at high temperatures. Further, SiC semiconductors have superior resistance to breakdown voltage. As a result, there has been vigorous research and development in recent years concerning semiconductor devices utilizing SiC substrates. However, when a metal electrode making contact with a SiC substrate is formed, an energy barrier develops at a boundary surface between the two. The height of the energy barrier is determined by the electron affinity of the SiC substrate, the forbidden band energy gap, and the work function of the metal electrode material. Since SiC semiconductors have an extremely wide forbidden band energy width, the energy barrier at the boundary surface between the electrode and the substrate is high particularly in the case where a metal electrode is formed that makes contact with a p-type SiC substrate. The higher the energy barrier at the boundary surface between the SiC substrate and the metal electrode is, the higher the contact resistance between the two. As a result it is difficult to form an ohmic electrode on a SiC substrate wherein this electrode has low contact resistance with the SiC substrate.

A method is set forth in J. Crofton, et al, "*Titanium and aluminum-titanium ohmic contacts to p-type SiC*", *Solid-State Electronics*, UK, Elsevier Science Ltd, 1997, vol. 41, pp. 1725-1729, wherein a Ti-layer and an Al-layer are formed in sequence on a surface of a SiC substrate, or an alloy layer of Ti and Al is formed and then, as shown in FIG. 15 appended to the present specification, thermal processing is performed at 1000° C. for 2 minutes. With this method, a reaction layer (a $Ti_3SiC_2$-layer) is formed on the surface of the SiC substrate. This reaction layer makes ohmic contact with the SiC substrate. It is thus possible, by utilizing the reaction layer, to form an electrode in which the contact resistance is low.

DISCLOSURE OF THE INVENTION

In the manufacturing method described above, metal layers are formed on the surface of the SiC substrate, and the thermal processing is performed at the high temperature of 1000° C. in one single process. As a result, the reaction layer formed by this manufacturing method includes various by-products.

For example, when the Ti-layer and the Al-layer are formed in sequence on the surface of the SiC substrate and the thermal processing is performed at 1000° C., the reaction layer does not become a uniform layer consisting of $Ti_3SiC_2$, but becomes a layer that includes the by-products $Al_4C_3$, $Ti_5Si_3C_x$, or TiC, etc.

When an electrode is formed utilizing a layer in which by-products other than $Ti_3SiC_2$ are present, the contact resistance thereof becomes greater, and an ohmic electrode with good characteristics cannot be formed.

Further, if a $Ti_3SiC_2$-layer that realizes satisfactory contact resistance is formed so as to be thick, bulk resistance in the $Ti_3SiC_2$-layer increases. As a result, it is necessary to form the $Ti_3SiC_2$-layer that makes contact with the SiC substrate as thinly and as uniformly as possible.

The present invention has been created to resolve the above problem. The present invention sets forth a technique for forming an ohmic electrode having good characteristics on a SiC substrate.

The inventors performed research into the relationship between temperature and material for Si, Ti, and Al at reactions of each other. As a result, they determined that the minimum temperature (a first temperature) of a temperature zone at which Ti of the Ti-layer reacts with the Al deposited on the Ti-layer to form $Al_3Ti$ is approximately 686° C. Further, they determined that the minimum temperature (a second temperature) of a temperature zone at which the $Al_3Ti$ reacts with the SiC of the SiC substrate to form $Ti_3SiC_2$ (a reaction layer) is approximately 970° C.

They determined that if a temperature below the second temperature is maintained until all the Ti of the Ti-layer has reacted with the Al, and the temperature is then raised to higher than or equal to the second temperature after all the Ti of the Ti-layer has reacted with the Al, it is possible to suppress the formation of the by-products such as $Al_4C_3$, $Ti_5Si_3C_x$, TiC, etc.

The present invention has been created on the basis of the aforementioned information, and can be realized in a method for manufacturing a semiconductor device comprising a SiC substrate and an electrode.

The present invention can be practiced as a method of manufacturing a semiconductor device comprising a SiC substrate and an electrode formed on the SiC substrate. The method comprises forming a Ti-layer on a surface of the SiC substrate, forming an Al-layer on a surface of the Ti-layer, and maintaining the SiC substrate, having the Ti-layer and the Al-layer, at a temperature that is higher than or equal to a first temperature and lower than a second temperature until all the Ti in the Ti-layer has reacted with the Al. The first temperature is the minimum temperature of a temperature zone at which the Ti reacts with the Al to form $Al_3Ti$, and the second temperature is the minimum temperature of a temperature zone at which the $Al_3Ti$ reacts with the SiC to form $Ti_3SiC_2$. As a result of this maintaining of temperature step, an $Al_3Ti$-layer is formed on the surface of the SiC substrate.

The method also comprises further heating of the SiC substrate having the $Al_3Ti$-layer to a temperature that is higher than the second temperature. As a result of this further heating step, the SiC substrate reacts with the $Al_3Ti$ of the $Al_3Ti$-layer to form a $Ti_3SiC_2$-layer on the surface of the SiC substrate.

In the aforementioned method, the temperature is not raised to be higher than or equal to the second temperature until all the Ti of the Ti-layer has reacted with the Al. The minimum temperature (the first temperature) of the temperature zone at which the Ti and the Al react to form the $Al_3Ti$ is lower than the minimum temperature (the second temperature) of the temperature zone at which the $Al_3Ti$ reacts with the SiC to form the $Ti_3SiC_2$. If the SiC substrate comprising the Ti-layer and the Al-layer is maintained at a temperature higher than or equal to the first temperature but lower than the second temperature, the Ti and the Al react to form the $Al_3Ti$, and a state can be maintained wherein the $Al_3Ti$ that has been formed does not react with the SiC. The $Al_3Ti$ can thus be prevented from reacting with the SiC until after all the Ti of the Ti-layer has reacted with the Al.

When the temperature is then raised to a temperature higher than or equal to the second temperature, the $Al_3Ti$ and the SiC react to form the $Ti_3SiC_2$. At this juncture, the temperature is raised to a temperature higher than or equal to the second temperature after all the Ti of the Ti-layer has reacted with the Al, and consequently it is possible to suppress the formation of by-products such as $Al_4C_3$, $Ti_5Si_3C_x$, or TiC.

The SiC substrate may be maintained at a constant temperature that is higher than or equal to the first temperature but lower than the second temperature. Alternatively, the temperature may gradually be raised from the first temperature toward the second temperature. Either method may be utilized as long as the relationship is obtained wherein all the Ti of the Ti-layer has reacted with the Al before the second temperature is reached.

With this method, it is possible to form a uniform $Ti_3SiC_2$ reaction layer. By utilizing this reaction layer an ohmic electrode having low contact resistance can be formed.

In this method, it is preferred that the step of forming the Al-layer is terminated when a thickness of the Al-layer has grown to between 2.84 times to 4 times a thickness of the Ti-layer.

As described above, in the present method the $Al_3Ti$-layer that makes contact with the SiC substrate is formed by maintaining the SiC substrate that comprises the Ti-layer and the Al-layer in the temperature zone that is higher than or equal to the first temperature but less than the second temperature. At this juncture, if the number of Al atoms in the Al-layer is three times the number of Ti atoms in the Ti-layer, the two react at just the right amount to form the $Al_3Ti$. In this case, the thickness ratio of the Ti-layer and the Al-layer is 1:2.84. If the thickness of the Ti-layer is greater than this thickness ratio, either unreacted Ti remains present, or there is an increase in Al—Ti group intermetallic compounds other than $Al_3Ti$, such as $TiAl_2$ or $\gamma TiAl$. This state is not preferred for forming an ohmic electrode that has low contact resistance with a SiC substrate. If the Al-layer is much thicker than the aforementioned thickness ratio, a liquefied Al-layer remains present on the $Al_3Ti$-layer. When a certain amount of an Al molten layer remains present on the $Al_3Ti$-layer, this does not exert an influence on the reaction between the SiC substrate and the $Al_3Ti$-layer at the step where the SiC substrate provided with the $Al_3Ti$-layer is heated to a temperature higher than or equal to the second temperature. However, in the case where the Al-layer is extremely thick (at the step where the SiC substrate provided with the Ti-layer and the Al-layer is heated), the Al molten layer reaches the SiC substrate causing by-products to be formed. However, when the thickness ratio of the Ti-layer and the Al-layer reaches 1:4, the Al molten layer does not have adverse affects when the SiC substrate and the $Al_3Ti$-layer react at the step where the SiC substrate provided with the $Al_3Ti$-layer is heated to a temperature higher than or equal to the second temperature. There is also no increase in by-products other than $Ti_3SiC_2$.

In the aforementioned description (at the step where the SiC substrate provided with the Ti-layer and the Al-layer is heated), loss in the number of Al atoms in the Al-layer due to evaporation from the surface of the Al molten layer has been left out of consideration. The number of Al atoms evaporated from the Al surface per unit area in unit time is determined uniquely by the temperature to which the SiC substrate is heated and the state of the atmosphere. As a result, it is preferred that, by considering the temperature and the atmosphere applied in the thermal processing (during the step of heating the SiC substrate provided with the Ti-layer and the Al-layer), the Al-layer is formed within the aforementioned thickness zone (the thickness ratio of the Ti-layer and the Al-layer is between 1:2.84 to 1:4) in the step of forming the Al-layer on the Ti-layer.

In this method, it is preferred that the step of further heating the SiC substrate having the $Al_3Ti$-layer to a temperature greater than the second temperature is terminated when a thickness of the $Ti_3SiC_2$-layer has grown to between 5 nm and 50 nm.

If the thickness of the $Ti_3SiC_2$-layer is between 5 nm and 50 nm, it is possible to form an electrode that has low contact resistance.

In this method, it is preferred that the step of maintaining the SiC substrate having the Ti-layer and the Al-layer at the temperature between the first and the second temperatures continues for longer than or equal to 1 minute. All the Ti of the Ti-layer can thus be made to react reliably with the Al.

In utilizing the aforementioned method, the SiC substrate on whose surface an electrode is formed may be p-type.

It is difficult to form an ohmic electrode having good characteristics on a p-type SiC substrate. However, it is possible to form an ohmic electrode having good characteristics on a p-type SiC substrate by utilizing the aforementioned method.

The present inventors found the following phenomena in their research: if the atmospheric temperature of the environment around the SiC substrate is maintained at a temperature that is higher than or equal to the first temperature but lower than the second temperature, and the Al is deposited on the surface of the Ti-layer at that temperature, heat is generated when the Al liquefies, and reactive heat is generated when the Al deposited on the surface reacts with the Ti, whereby the temperature of the surface of the SiC substrate is raised to be equal to or higher than the second temperature. The inventors found that when the $Ti_3SiC_2$ was formed utilizing this phenomenon, the formation of by-products other than $Ti_3SiC_2$ was suppressed. A second method of the present invention is created based on the aforementioned knowledge.

A second method of the invention comprises forming a Ti-layer on a surface of the SiC substrate and depositing Al on a surface of the Ti-layer at a predetermined temperature that is higher than or equal to the first temperature and lower than the second temperature. The first temperature is the minimum temperature of the temperature zone at which Ti reacts with Al to form $Al_3Ti$, and the second temperature is the minimum temperature of the temperature zone at which the $Al_3Ti$ reacts with SiC to form $Ti_3SiC_2$. As a result of deposition, Ti in the Ti-layer reacts with the deposited Al to form $Al_3Ti$ on the surface of the SiC substrate, condensation heat is generated by the deposition of the Al, reaction heat is generated by the reaction of forming the $Al_3Ti$, and the condensation heat and the reaction heat increase the temperature of the surface of the SiC substrate above the second temperature; whereby the SiC substrate reacts with the $Al_3Ti$ to form a $Ti_3SiC_2$-layer on the surface of the SiC substrate. The $Ti_3SiC_2$-layer is formed during the step of depositing the Al.

When a semiconductor device is manufactured by the aforementioned method, the Al deposited on the surface of the Ti-layer reacts with the Ti almost simultaneously as it is being deposited. As a result, it is possible for the reaction with the SiC to proceed in a state in which unreacted Ti does not remain present. The condensation heat and the reaction heat are obtained simultaneously with the Ti of the Ti-layer reacting with the Al to form the $Al_3Ti$, whereby the temperature increases to higher than or equal to the second temperature. As a result of this, the SiC of the SiC substrate reacts with the Al$_3$Ti. It is thus possible for the SiC to react only with the Al$_3$Ti, thus forming a uniform Ti$_3$SiC$_2$-layer. It is also possible to uniformly form a Ti$_3$SiC$_2$-layer that includes only a small amount of by-products such as Al$_4$C$_3$, Ti$_5$Si$_3$C$_x$, or TiC. When a reaction layer that includes only a small amount of by-products is utilized, it is possible to form an ohmic electrode having the good characteristic of low contact resistance within an electrode forming area.

In this method, it is preferred that the step of depositing Al is terminated when a thickness of the Ti$_3$SiC$_2$-layer has grown to between 2 nm and 30 nm.

It is thus possible to form an electrode having low contact resistance utilizing the Ti$_3$SiC$_2$-layer that has the aforementioned thickness.

In this method, it is also preferred that, in the step of depositing the Al on the Ti-layer, the temperature of the SiC substrate provided with the Ti-layer (the aforementioned predetermined temperature) is set to be about 850° C.

In this case, the surface temperature of the SiC substrate is not increased to higher than or equal to the second temperature by the condensation heat alone, but by both the condensation heat and the reaction heat. As a result, a Ti$_3$SiC$_2$-layer is formed that includes only a small amount of by-products apart from Ti$_3$SiC$_2$.

In utilizing the aforementioned method, the SiC substrate on whose surface an electrode is formed may be p-type.

With the conventional manufacturing method, it was difficult to form an ohmic electrode having good characteristics on a p-type SiC substrate. However, it is possible to form an ohmic electrode having good characteristics on a p-type SiC substrate by utilizing the aforementioned method.

The present invention is capable of realizing a semiconductor device having a novel configuration. This semiconductor device comprises a SiC substrate and an electrode making contact with the SiC substrate. The electrode comprises a Ti$_3$SiC$_2$-layer (reaction layer) and is substantially free from Al$_4$C$_3$.

In the conventional technique, as has been described, the reaction layer contains the by-product Al$_4$C$_3$ when this reaction layer is formed by the Ti-layer that makes contact with the SiC substrate and the Al-layer covering the Ti-layer being heated at 1000° C. However, since the reaction layer of the aforementioned semiconductor device is substantially free from Al$_4$C$_3$, it is possible to form an ohmic electrode that has low contact resistance with the SiC substrate.

Further, the semiconductor device comprises a SiC substrate and an electrode making contact with the SiC substrate. The electrode comprises a Ti$_3$SiC$_2$-layer (reaction layer) and is substantially free from Ti$_5$Si$_3$C$_x$.

Since the reaction layer of the aforementioned semiconductor device is substantially free from Ti$_5$Si$_3$C$_x$, it is possible to form an ohmic electrode that has low contact resistance with the SiC substrate.

Further, the semiconductor device comprises a SiC substrate and an electrode making contact with the SiC substrate. The electrode comprises a Ti$_3$SiC$_2$-layer (reaction layer) and is substantially free from TiC.

Since the reaction layer of the aforementioned semiconductor device is substantially free from TiC, it is possible to form an ohmic electrode that has low contact resistance with the SiC substrate.

According to the present invention, it is possible to form a Ti$_3$SiC$_2$-layer having only a small amount of by-products on the SiC substrate. By utilizing this layer, an ohmic electrode having good characteristics can be formed on the SiC substrate.

BEST MODE FOR CARRYING OUT THE INVENTION

First Embodiment

An embodiment of a semiconductor device for carrying out the present invention and a manufacturing method thereof will be described with reference to FIGS. 1 to 7. In the present embodiment, a case is described where the semiconductor device of the present invention is a p-channel MOSFET formed utilizing a SiC substrate.

Figure 1:
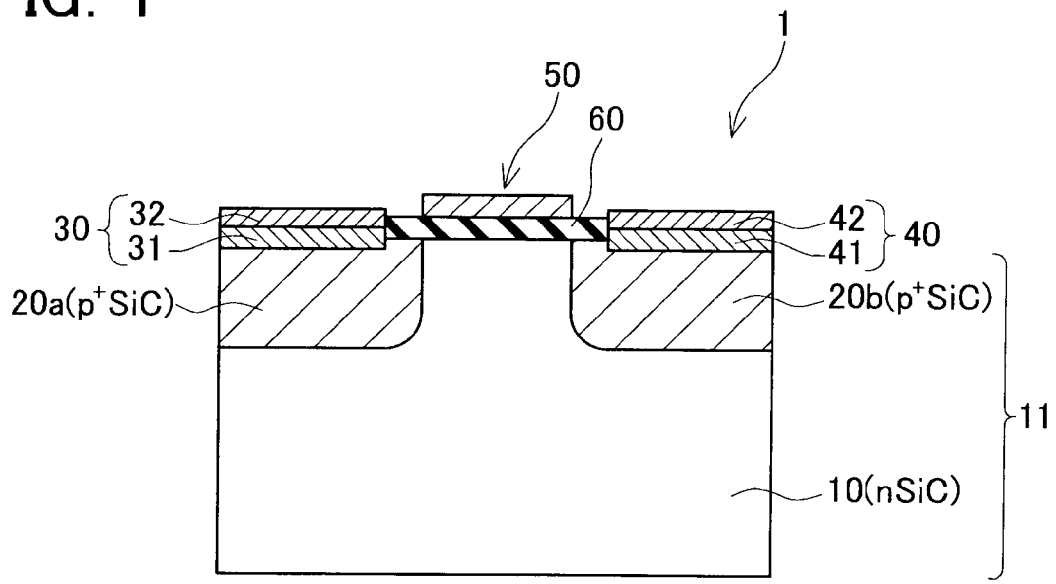
FIG. 1 shows a cross-sectional view of a semiconductor device of a first embodiment.
Figure 6:
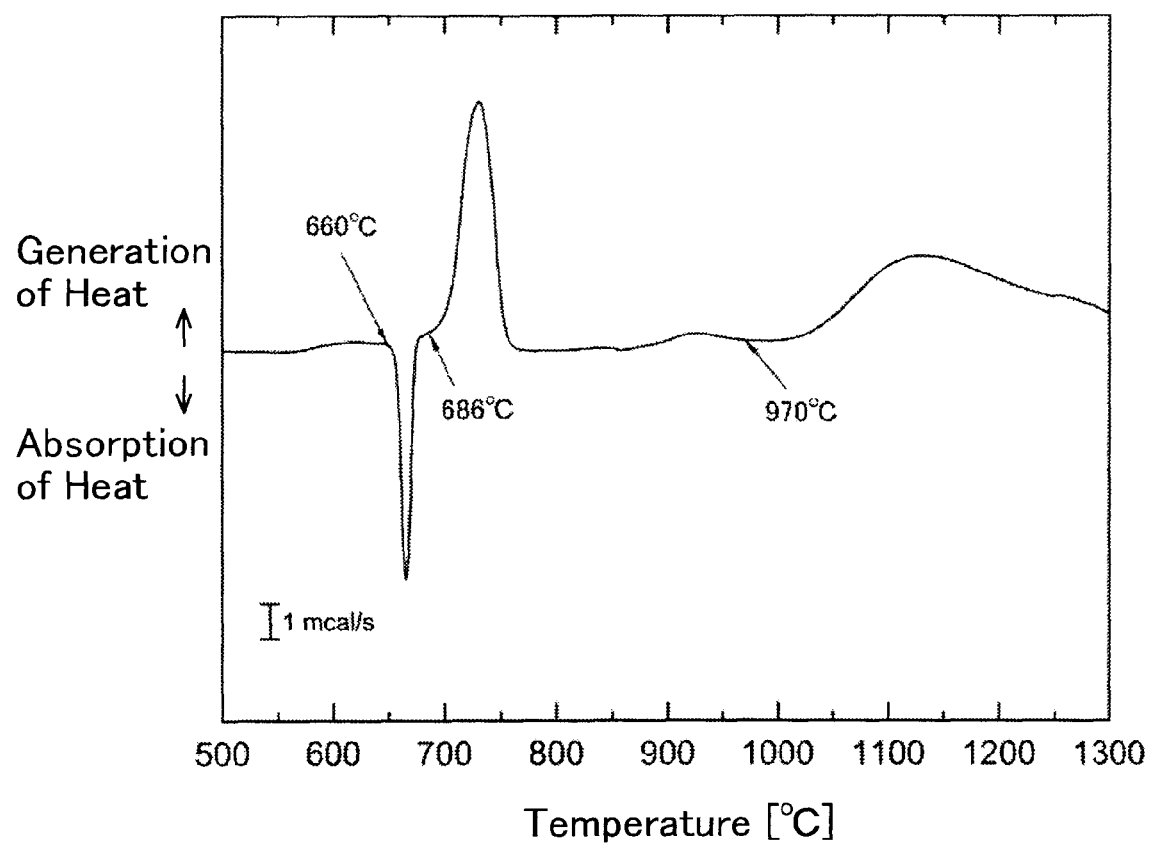
FIG. 6 shows a DSC (differential scanning calorimetry) curve showing the state of reactions of SiC, Ti, and Al with respect to temperature.
Figure 7:
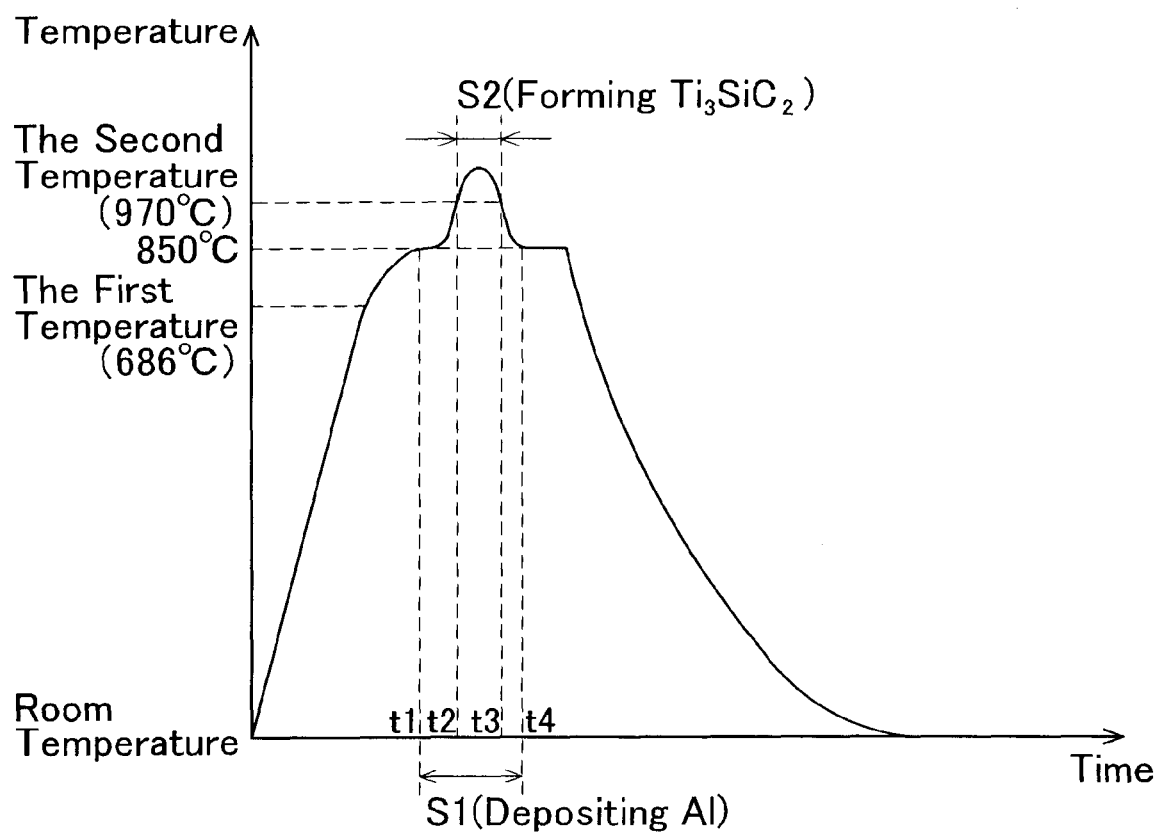
FIG. 7 shows temperature change at a boundary surface between a p$^+$ type SiC semiconductor layer and the source electrode that is being formed.

FIG. 1 is a cross-sectional view of a semiconductor device 1 of the present embodiment. FIGS. 2 to 5 describe steps for manufacturing an ohmic electrode (a source electrode 30) with which the semiconductor device 1 is provided. FIG. 6 is a DSC (differential scanning calorimetry) curve showing the state of reactions of SiC, Ti, and Al with respect to temperature. FIG. 7 shows temperature change at a boundary surface between the SiC substrate and the source electrode 30 that is being formed.

First, the schematic configuration of the semiconductor device 1 will be described with reference to the cross-sectional view of FIG. 1.

The semiconductor device 1 has a SiC substrate 11 provided with an n-type SiC semiconductor layer 10. The semiconductor device 1 comprises a pair of p+ type SiC semiconductor layers 20a and 20b formed at both ends of a surface side of the SiC semiconductor layer 10.

A $Ti_3SiC_2$ reaction layer 31 extends toward the center of the semiconductor device 1 from the left side of a surface of the p+ type SiC semiconductor layer 20a. The reaction layer 31 is formed from $Ti_3SiC_2$ having a thickness of 2 nm to 30 nm. Although this will be described in detail later, the reaction layer 31 is substantially free from by-products such as $Al_4C_3$, $Ti_5Si_3C_x$, or TiC. The reaction layer 31 makes ohmic contact with the p+ type SiC semiconductor layer 20a. Further, a region not covered by the reaction layer 31 is present at the surface of the p+ type SiC semiconductor layer 20a at the center of the semiconductor device 1.

A surface layer 32 is formed on the reaction layer 31. The surface layer 32 is formed from Al. The reaction layer 31 and the surface layer 32 form a source electrode 30, which is an ohmic electrode.

Similarly, a $Ti_3SiC_2$ reaction layer 41 extends toward the center of the semiconductor device 1 from the right side of a surface of the p+ type SiC semiconductor layer 20b. The reaction layer 41 is formed from $Ti_3SiC_2$ having a thickness of 2 nm to 30 nm. The reaction layer 41 is substantially free from by-products such as $Al_4C_3$, $Ti_5Si_3C_x$, or TiC. The reaction layer 41 makes ohmic contact with the p+ type SiC semiconductor layer 20b. Further, a region not covered by the reaction layer 41 is present at the surface of the p+ type SiC semiconductor layer 20b at the center of the semiconductor device 1.

A surface layer 42 is formed on the reaction layer 41. The surface layer 42 is formed from Al. The reaction layer 41 and the surface layer 42 form a drain electrode 40, which is an ohmic electrode.

A gate isolating layer 60 extends from the surface of the p+ type SiC semiconductor layer 20a that is not covered by the reaction layer 31 across to the surface of the p+ type SiC semiconductor layer 20b that is not covered by the reaction layer 41. The gate isolating layer 60 extends across the surface of the n-type SiC semiconductor layer 10. A gate electrode 50 is formed on the gate isolating layer 60.

The semiconductor device 1 that has the above configuration is turned on when a predetermined source-drain voltage is applied between the source electrode 30 and the drain electrode 40 and when a predetermined gate voltage is also applied to the gate electrode 50. This means that a p-type channel capable of transporting carriers is formed in an n-type surface region (a region facing the gate electrode 50 via the gate isolating layer 60) that is present between the p+ type SiC semiconductor layer 20a and the p+ type SiC semiconductor layer 20b. Carriers are transported between the source electrode 30 and the drain electrode 40 via this channel, whereby current flows between the source electrode 30 and the drain electrode 40, and the semiconductor device 1 is turned on. The channel is extinguished when the voltage applied to the gate electrode 50 becomes less than a gate voltage capable of turning on the semiconductor device 1. Thereupon, carriers can no longer be transported between the source electrode 30 and the drain electrode 40, and the semiconductor device 1 is turned off.

Next, important steps for manufacturing the semiconductor device 1 will be described. Here, the major steps for forming the source electrode 30 will be described. As described above, the source electrode 30 is formed on the surface of the p+ type SiC semiconductor layer 20a. As described in the background art, it was difficult to form an ohmic electrode that has low contact resistance with a p+ type SiC substrate. In the steps of forming the source electrode 30 of the present embodiment, the formation of by-products other than a desired product is prevented. Since by-products cause an increase in the contact resistance of an electrode that is ultimately formed, it is thus possible to form the source electrode 30 that is an ohmic electrode with low contact resistance.

First, the n-type SiC substrate 11 is formed (see FIG. 1). Then, in accordance with a normal p-channel MOSFET forming process, a combination of the following steps is performed in sequence on the substrate: an oxidizing step, a photolithography step, an etching step, an ion implantation step, etc. The gate isolating layer 60 and the gate electrode 50 formed from poly-silicon, and the p+ type semiconductor layers 20a and 20b are thus formed on the SiC substrate 11. Then an oxidized layer (not shown specifically) for insulating the gate electrode 50, etc. is deposited utilizing the CVD (Chemical Vapor Deposition) method.

Next, a contact hole for forming the source electrode 30 is formed utilizing photolithography on the oxidized layer covering the surface of the p+ type SiC semiconductor layer 20a. Further, a contact hole for forming the drain electrode 40 is formed utilizing photolithography on the oxidized layer covering the surface of the p+ type SiC semiconductor layer 20b. Then the source electrode 30 is formed on the surface of the p+ type SiC semiconductor layer 20a where the contact hole has been formed. Further, the drain electrode 40 is formed on the surface of the p+ type SiC semiconductor layer 20b where the contact hole has been formed.

Below, the formation of the source electrode 30 on the surface of the p+ type SiC semiconductor layer 20a will be described in detail with reference to FIGS. 2 to 5 and to FIG. 7. Although only the formation step of the source electrode 30 is described below, the drain electrode 40 is formed on the surface of the p+ type SiC semiconductor layer 20b simultaneously with the formation of the source electrode 30. Moreover, in FIGS. 2 to 5, the p+ type SiC semiconductor layer 20a part of the semiconductor device 1 shown in FIG. 1 is shown enlarged.

Figure 2:
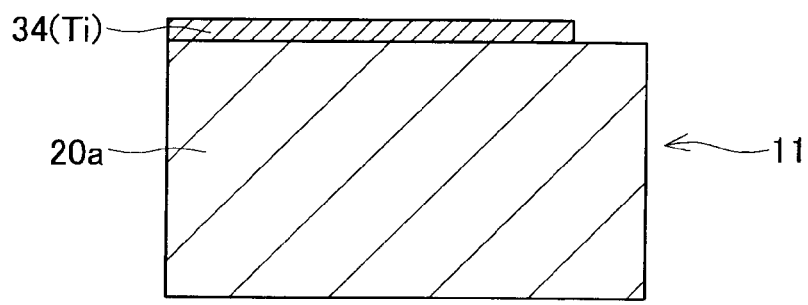
FIG. 2 shows a first step of the first embodiment for forming, on a SiC substrate, a source electrode that has low contact resistance with the SiC substrate.

First, as shown in FIG. 2, a Ti-layer 34 is deposited on a portion of the surface of the p+ type SiC semiconductor layer 20a where the source electrode 30 is to be formed. The Ti-layer 34 is formed having a thickness being the thinnest capable of forming a uniform layer on the p+ type SiC semiconductor layer 20a.

Next, as shown in FIG. 7, the SiC substrate 11 that includes the p+ type SiC semiconductor layer 20a and the Ti-layer 34 is heated to 850° C. This temperature of 850° C. will be described in detail later. The temperature of the SiC substrate 11 increases, and a boundary surface 39a between the p+ type SiC semiconductor layer 20a and the Ti-layer 34 reaches 850° C. at time t1. In this state where the Ti-layer 34 is only being deposited, the Ti of the Ti-layer 34 and the SiC of the p+ type SiC semiconductor layer 20a do not react even if the temperature has reached 850° C.

Next, an Al-layer 37 (see also FIG. 3) is deposited on the Ti-layer 34 from the time t1 shown in FIG. 7 while the SiC substrate 11 is being maintained at a temperature of 850° C.

That is, Al that is in a gaseous state is made to condense on the Ti-layer 34. The Al-layer 37 that has condensed can be considered to be in a liquid state.

The temperature of 850° C. is greater than the first temperature (686° C.), which is the minimum temperature of a temperature zone at which the Ti reacts with the Al to form $Al_3Ti$. As a result, while the Al-layer 37 is being deposited on the Ti-layer 34 at 850° C., the Al that has been deposited reacts with the Ti of the Ti-layer 34, forming an $Al_3Ti$-layer 39 (see also FIG. 4).

Reaction heat is generated by this reaction. The reaction heat and condensation heat caused by the Al condensing from a gas to a liquid increase the temperature of the boundary surface 39a from 850° C. However, the effects of the condensation heat of the Al on the reaction behavior of the SiC and the $Al_3Ti$ are small. As shown in FIG. 7, from time t1 the reaction heat and the condensation heat increase the temperature of the boundary surface 39a even if the temperature of the environment in which the SiC substrate 11 is present is being maintained at 850° C. When the temperature of the boundary surface 39a reaches 970° C. or more at time t2 shown in FIG. 7, the SiC of the $p^+$ type SiC semiconductor layer 20a and the $Al_3Ti$ of the $Al_3Ti$-layer 39 react, starting the formation of a $Ti_3SiC_2$ reaction layer 31 (see also FIG. 5) at the boundary surface 39a. The 970° C. is the minimum temperature of a temperature zone at which the SiC and the $Al_3Ti$ react to form the $Ti_3SiC_2$. The formation of the reaction layer 31 continues while the temperature of the boundary surface 39a is 970° C. or higher (the period S2 shown in FIG. 7).

When all the Ti of the Ti-layer 34 has reacted, the reaction forming the $Al_3Ti$-layer 39 from the Ti of the Ti-layer 34 and the Al-layer 37 terminates. Thereupon, the generation of reaction heat ends. The temperature of the boundary surface 39a falls from 970° C. When the temperature of the boundary surface 39a decreases to below 970° C. at time t3 shown in FIG. 7, the reaction terminates between the SiC of the $p^+$ type SiC semiconductor layer 20a and the $Al_3Ti$ of the $Al_3Ti$-layer 39. Actually, the time while the temperature of the boundary surface 39a is 970° C. or higher (the period S2 shown in FIG. 7) is minute, and an extremely thin reaction layer 31 can be formed at the boundary surface 39a.

In the present embodiment, the deposition of the Al-layer 37 terminates and the heating of the SiC substrate 11 terminates at time t4 shown in FIG. 7. The SiC substrate 11 then cools. In the present embodiment, the Al-layer 37 is deposited on the Ti-layer 34 during the period S1 from time t1 to time t4.

Figure 3:
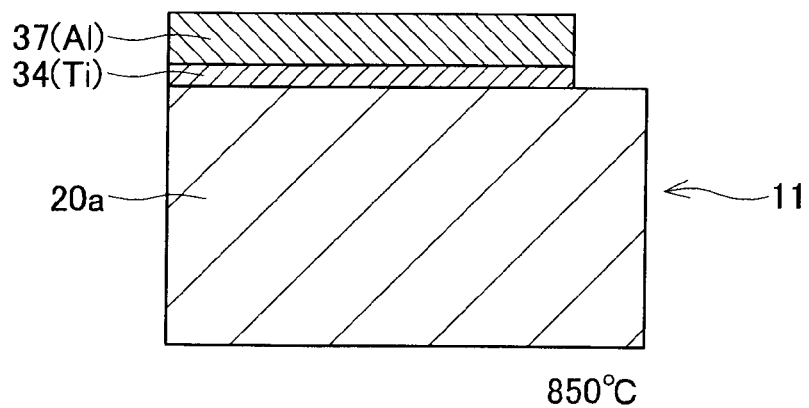
FIG. 3 shows a second step of the first embodiment for forming, on the SiC substrate, the source electrode that has low contact resistance with the SiC substrate.
Figure 4:
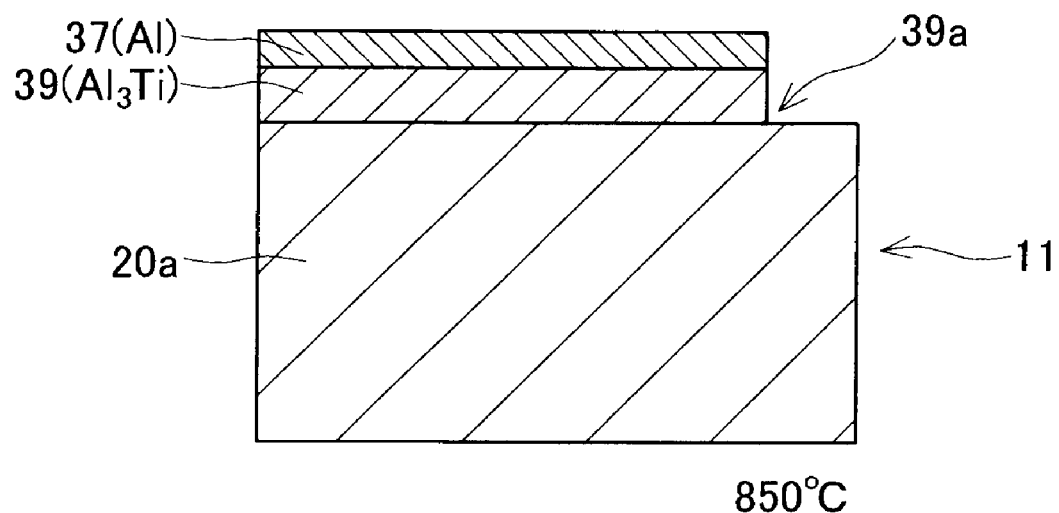
FIG. 4 shows a third step of the first embodiment for forming, on the SiC substrate, the source electrode that has low contact resistance with the SiC substrate.
Figure 5:
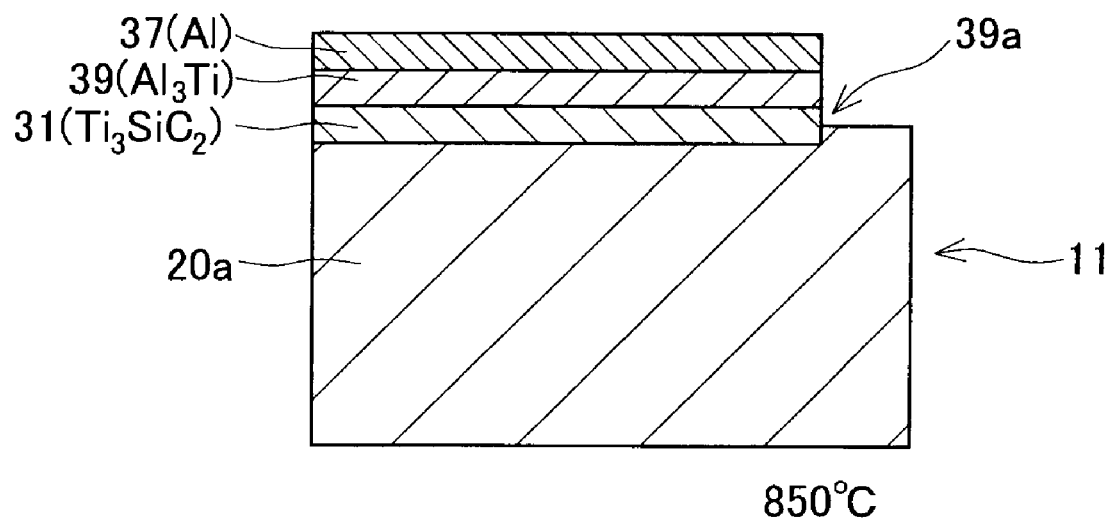
FIG. 5 shows a fourth step of the first embodiment for forming, on the SiC substrate, the source electrode that has low contact resistance with the SiC substrate.

For the sake of convenience, the states of a chain reaction that proceeds almost simultaneously have been separated into FIG. 3, FIG. 4, and FIG. 5 in the above description.

FIG. 3 shows a state where the Al-layer 37 is being deposited on the Ti-layer 34. FIG. 4 shows a state where the Ti of the Ti-layer 34 and the Al of the Al-layer 37 being deposited on the Ti-layer 34 are reacting to form the $Al_3Ti$-layer 39. During the aforementioned reaction, the deposition of the Al-layer 37 continues, and the Al-layer 37 is present on an upper part of the $Al_3Ti$-layer 39. FIG. 5 shows a state where the $Ti_3SiC_2$ is formed on the boundary surface 39a, the unreacted $Al_3Ti$-layer 39 and the Al-layer 37 are present thereabove.

Since the reactions described above occur almost simultaneously, the states shown in FIGS. 3 to 5 are not necessarily present. In fact, when the deposition of Al starts at 850° C., as shown in FIG. 3, the reaction to form the $Al_3Ti$ shown in FIG. 4, starts almost simultaneously. At this juncture, the Al-layer 37 may remain present as shown in FIG. 4, or may not remain present. Further, when the reaction to form the $Al_3Ti$ begins, the reaction to form the $Ti_3SiC_2$ shown in FIG. 5 starts almost simultaneously. Moreover, the $Al_3Ti$-layer 39 and the Al-layer 37 may remain present as shown in FIG. 5, or may not remain present.

The substrate is left for its temperature to return to at least the melting point of aluminum (660° C.) or below.

As shown in FIG. 5, in the case where the unreacted $Al_3Ti$-layer 39 or the Al-layer 37 is present above the reaction layer 31, the $Al_3Ti$-layer 39 and the Al-layer 37 are removed. Then the Al surface layer 32 is formed at the upper part of the reaction layer 31, forming the source electrode 30 (see also FIG. 1). As described above, the drain electrode 40 has the same configuration as the source electrode 30, and is formed simultaneously with the source electrode 30.

In the method of manufacturing the semiconductor device of the present embodiment, the step of depositing the Al-layer 37 on the Ti-layer 34 occurs only while the temperature of the SiC substrate 11 provided with the Ti-layer 34 has been raised to 850° C. This temperature of 850° C. will be described below.

As shown in FIG. 6, the present inventors observed a DSC (differential scanning calorimetry) curve showing the state of reactions of SiC, Ti, and Al with respect to temperature.

According to this, Al melts at 660° C., and at about 680° C. the Al stops absorbing heat and is fully melted. At 686° C. (the first temperature), the molten Al generates heat while beginning to react with the Ti. When the Al and the Ti react, $Al_3Ti$ is formed. Then, at around 970° C. (the second temperature), the $Al_3Ti$ generates heat while beginning to react with the SiC. When the $Al_3Ti$ and the SiC react, $Ti_3SiC_2$ is formed. By means of the above step, the $Al_3Ti$ and the SiC thus react to form the $Ti_3SiC_2$ while the temperature of the boundary surface 39a is above 970° C.

In order to form an ohmic electrode that has low contact resistance with the SiC substrate, it is preferred that the $Ti_3SiC_2$-layer does not include by-products such as $Al_4C_3$, $Ti_5Si_3C_x$, or TiC.

In the method of manufacturing the semiconductor device of the present embodiment, the $Ti_3SiC_2$ is formed only in the period while the temperature of the boundary surface 39a is equal to or higher than 970° C., this state being caused by the reaction heat of the Ti and the Al. The reaction of the SiC with the $Al_3Ti$ is terminated when the temperature of the boundary surface 39a falls below 970° C., and the $Ti_3SiC_2$ is no longer formed. Since, as described above, the period between the start and the termination of the reaction is so minute, it is possible to form the extremely thin $Ti_3SiC_2$ reaction layer 31. Furthermore, unreacted Ti is not present at the boundary surface 39a. While the Ti is reacting with the Al to form the $Al_3Ti$, the Ti reacts simultaneously with the SiC as a result of the temperature rise caused by the condensation heat and reaction heat. The thin $Ti_3SiC_2$ reaction layer 31 formed at the boundary surface 39a is uniform, and contains only a small amount of by-products such as $Al_4C_3$, $Ti_5Si_3C_x$, or TiC. It is thus possible to form the thin uniform $Ti_3SiC_2$ reaction layer 31. The thinner the reaction layer 31 is, the more possible it is to reduce the integrated resistance of the electrode part (i.e. the sum of the contact resistance and the bulk resistance of the electrode). It is thus possible, utilizing this reaction layer 31, to form the source electrode 30 which is an ohmic electrode having low contact resistance.

In the present embodiment, as shown in FIG. 3, the temperature of the SiC substrate 11 provided with the Ti-layer 34 is maintained at 850° C. during the step of depositing the Al-layer 37 on the Ti-layer 34. In short, however, as long as the aforementioned condensation heat and reaction heat are obtained and the temperature of the boundary surface 39a reaches 970° C. or more for a minute period, thus forming the thin $Ti_3SiC_2$ reaction layer 31, the temperature at which the SiC substrate 11 provided with the Ti-layer 34 is not restricted to 850° C. Further, this temperature need not be maintained at a constant temperature throughout this period.

Second Embodiment

A second embodiment of a semiconductor device for carrying out the present invention and a manufacturing method thereof will be described with reference to FIG. 1 and FIGS. 8 to 13. In the present embodiment, the case is described where the semiconductor device 1 of the first embodiment (see FIG. 1) is manufactured using a different manufacturing method.

Figure 12:
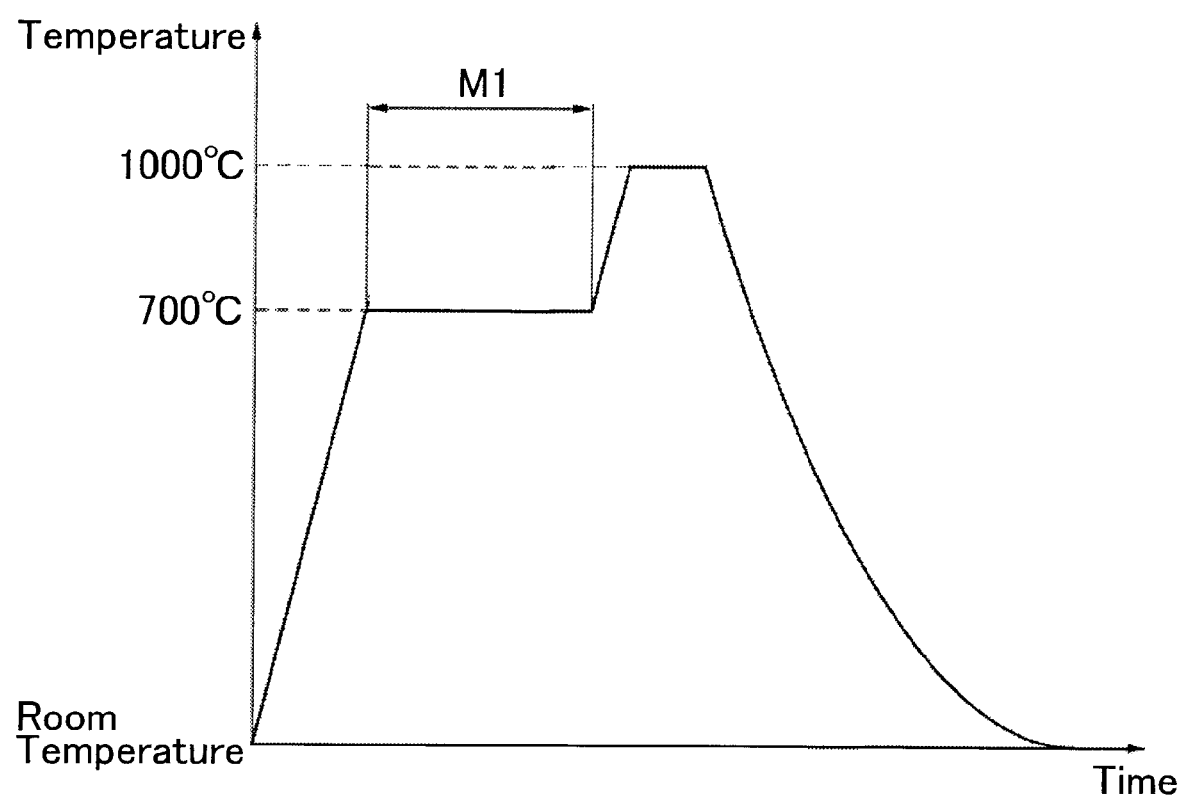
FIG. 12 is a figure describing an example of temperature change during thermal processing while the source electrode is being formed.
Figure 13:
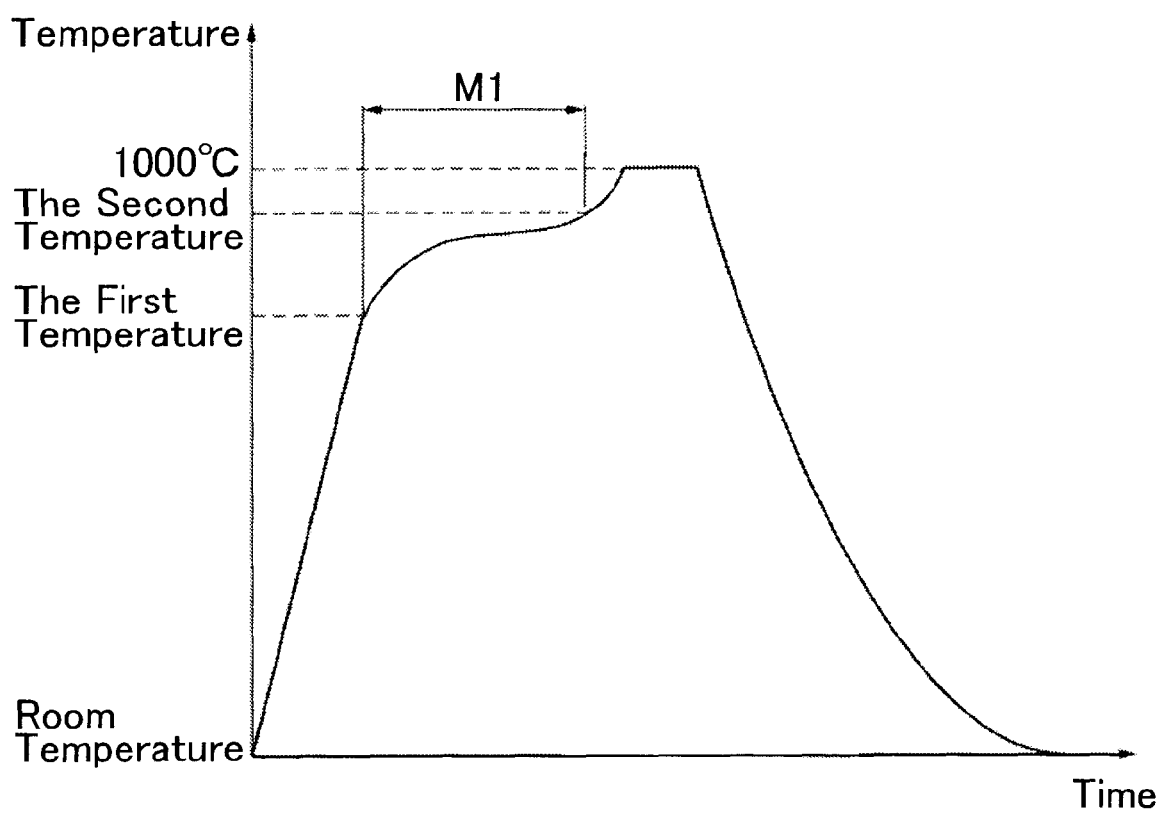
FIG. 13 is a figure describing another example of temperature change during thermal processing while the source electrode is being formed.

FIGS. 8 to 11 are figures describing manufacturing steps of the source electrode 30 with which the semiconductor device 1 is provided. FIGS. 12 and 13 are figures describing temperature change patterns during thermal processing while the source electrode is being formed.

Major steps of forming the source electrode 30 of FIG. 1 on the surface of the $p^+$ type SiC semiconductor layer 20a will be described with reference to FIGS. 8 to 11. Although only the step of forming the source electrode 30 is described below, a drain electrode 40 is formed on the surface of the $p^+$ type SiC semiconductor layer 20b simultaneously with the formation of the source electrode 30. Moreover, in FIGS. 8 to 11, the $p^+$ type SiC semiconductor layer 20a of the semiconductor device 1 shown in FIG. 1 is shown enlarged.

Figure 8:
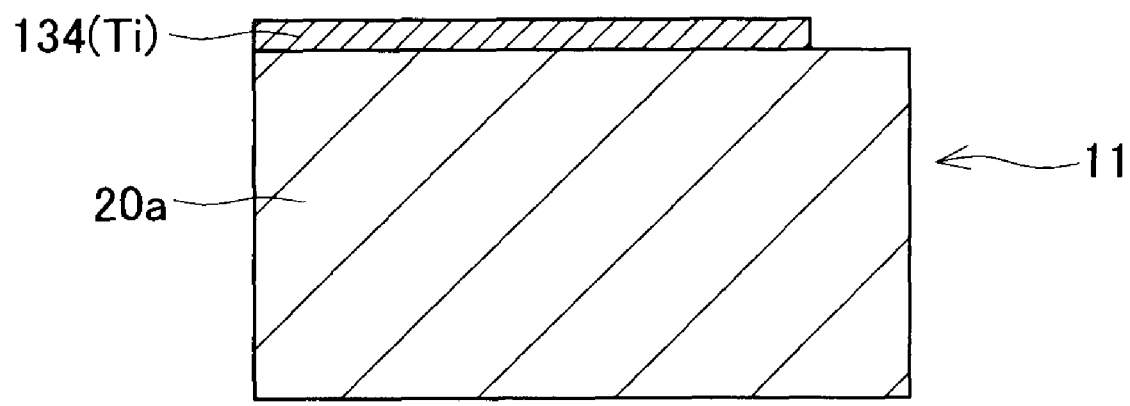
FIG. 8 shows a first step of a second embodiment for forming, on the SiC substrate, the source electrode that has low contact resistance with the SiC substrate.
Figure 9:
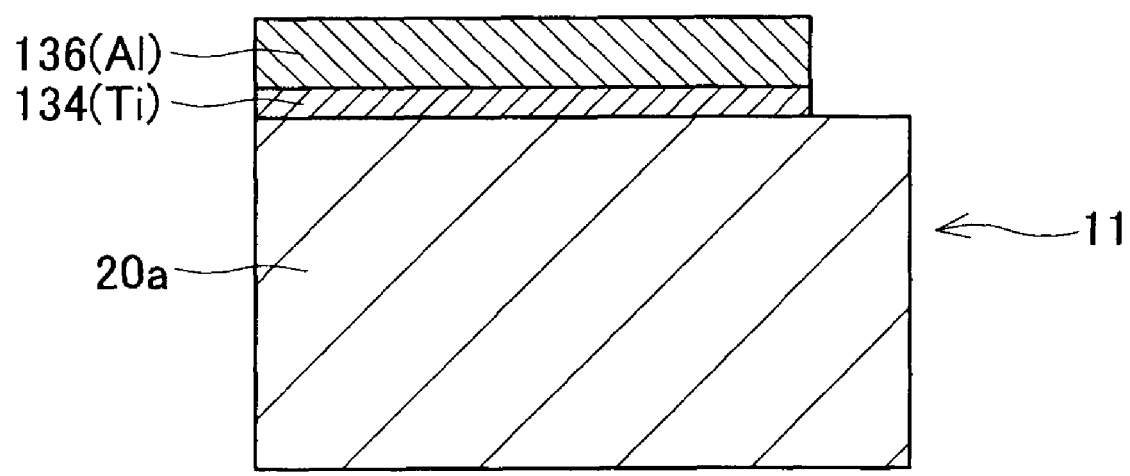
FIG. 9 shows a second step of the second embodiment for forming, on the SiC substrate, the source electrode that has low contact resistance with the SiC substrate.

First, as shown in FIG. 8, a Ti-layer 134 is deposited on a portion of the surface of the $p^+$ type SiC semiconductor layer 20a where the source electrode 30 is to be formed. Next, as shown in FIG. 9, an Al-layer 136 is deposited on the Ti-layer 134. The Ti-layer 134 and the Al-layer 136 are formed having a thickness ratio within the range of 1:2.84 to 1:4.

Figure 10:
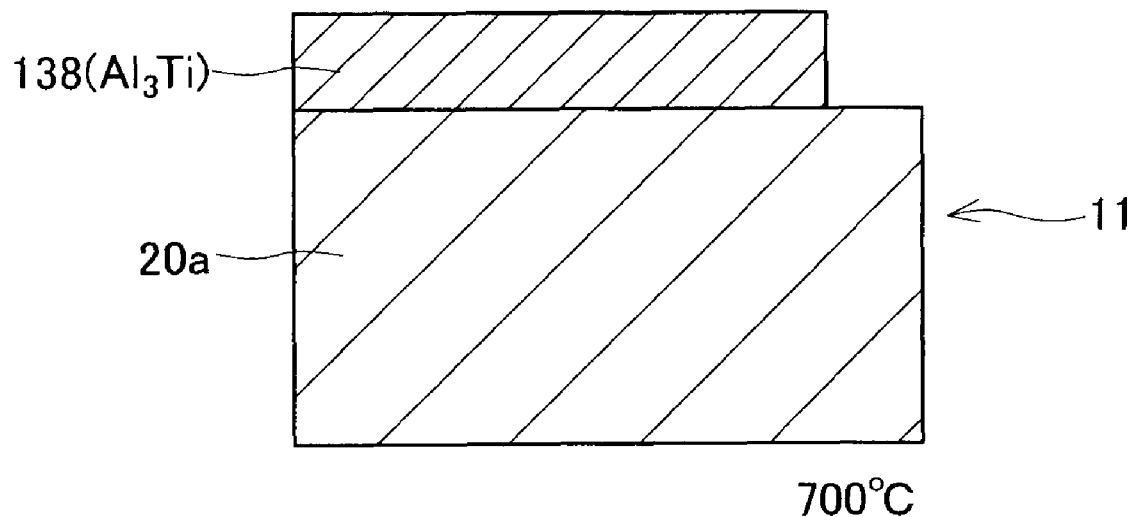
FIG. 10 shows a third step of the second embodiment for forming, on the SiC substrate, the source electrode that has low contact resistance with the SiC substrate.
Figure 11:
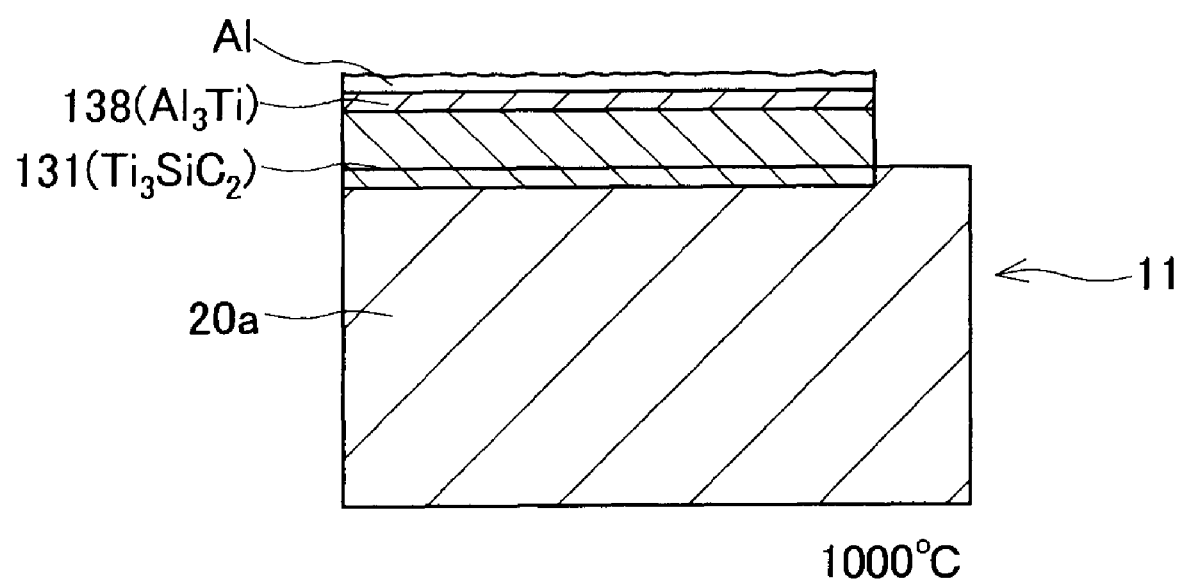
FIG. 11 shows a fourth step of the second embodiment for forming, on the SiC substrate, the source electrode that has low contact resistance with the SiC substrate.

Next, the SiC substrate 11 that includes the $p^+$ type SiC layer 20a, the Ti-layer 134 and the Al-layer 136 is heated. As shown in FIG. 12, the SiC substrate 11 is heated from room temperature until the temperature thereof is 700° C. This temperature of 700° C. will be described in detail later. When the temperature of the substrate reaches 686° C. or higher, the Ti of the Ti-layer 134 and the Al of the Al-layer 136 react, and the formation of $Al_3Ti$ begins (see also FIG. 6). After the substrate has reached a temperature of 700° C., the substrate continues to be heated so as to maintain its temperature at 700° C. during period M1 shown in FIG. 12. The period M1 is set to be longer than a period in which all the Ti of the Ti-layer 134 has reacted with the Al of the Al-layer 136 and the reaction for forming the $Al_3Ti$ has terminated. Since the period until the reaction ends is also related to characteristics such as the thickness, etc. of the Ti-layer 134 and the Al-layer 136, the period M1 is not determined uniformly, but is usually a period between 1 to 60 minutes. The important point is that the reaction for forming the $Al_3Ti$ has terminated when the period M1 has ended. In the case where the thickness ratio of the Ti-layer 134 to the Al-layer 136 is 1:2.84, as described above, and the number of Al atoms lost from the surface of the Al-layer 136 due to evaporation is small enough to be negligible, the Ti of the Ti-layer 134 and the Al of the Al-layer 136 react at just the right amount to form the $Al_3Ti$. As shown in FIG. 10, an $Al_3Ti$-layer 138 is thus formed. Unreacted Al and Ti making contact with the $p^+$ type SiC semiconductor layer 20a are not present.

Next, as shown in FIG. 12, the SiC substrate 11 is heated from 700° C. until it reaches a temperature of 1000 degrees. This temperature of 1000° C. will be described in detail later. When the SiC substrate 11 has reached a second temperature of 970° C. or higher, the $Al_3Ti$-layer 138 reacts with the $p^+$ type SiC semiconductor layer 20a, and the formation of $Ti_3SiC_2$ begins (see also FIG. 6). After the SiC substrate 11 has reached a temperature of 1000° C., the substrate continues to be heated so as to maintain its temperature at 1000° C. for 2 minutes. After this predetermined time has passed, the substrate is cooled to a sufficiently low temperature, whereupon the reaction between the $Al_3Ti$-layer 138 and the $p^+$ type SiC semiconductor layer 20a ends. Then the substrate is allowed to cool to at least the melting point of aluminum (660° C.) or below. At this point, the $Ti_3SiC_2$ reaction layer 131 shown in FIG. 11 has been formed thinly across the entire boundary surface between the $Al_3Ti$-layer 138 and the $p^+$ type SiC semiconductor layer 20a. The Al surface layer 32 (see FIG. 1) is formed above the reaction layer 131, forming the source electrode 30.

The following out of the aforementioned manufacturing steps will be described in detail: the temperature (700° C.) at which the SiC substrate 11 provided with the Ti-layer 134 and the Al-layer 136 is maintained during the step of forming the $Al_3Ti$-layer 138, and the temperature (1000° C.) at which the SiC substrate 11 is maintained during the step of forming the reaction layer 131.

According to the DSC (differential scanning calorimetry) curve shown in FIG. 6, showing the state of reactions of SiC, Ti, and Al with respect to temperature, Al melts at 660° C. At the first temperature of 686° C. the molten Al generates heat while beginning to react with the Ti. When the Al and the Ti react, $Al_3Ti$ is formed. As a result, if the temperature of the SiC substrate 11 is maintained at 700° C. during the step of forming the $Al_3Ti$-layer 138, the Al and the Ti continue to react throughout this period 700° C. is maintained. At the point where the amount of either the Al or Ti runs out, the reaction between the Al and the Ti ends. Further, this temperature of 700° C. differs from the manufacturing method of the first embodiment in that the temperature of the SiC substrate 11 is not raised to the second temperature of 970° C. or higher by the reaction heat when the Al and the Ti react to form the $Al_3Ti$. As a result, the $Al_3Ti$ formed by the reaction of the Al and the Ti remains present as the $Al_3Ti$-layer 138 on the surface of the $p^+$ type SiC semiconductor layer 20a.

The $Al_3Ti$ generates heat while beginning to react with the SiC at around 970° C. When the $Al_3Ti$ and the SiC react, $Ti_3SiC_2$ is formed. As a result, if the temperature of the SiC substrate 11 is maintained is at 1000° C. during the step of forming the $Ti_3SiC_2$ reaction layer 131, the $Al_3Ti$-layer 138 and the SiC of the $p^+$ type SiC semiconductor layer 20a continue to react throughout this period 1000° C. is maintained. After the SiC substrate 11 has been maintained at this temperature for a predetermined period, the SiC substrate 11 is cooled. When the SiC substrate 11 reaches a sufficiently low temperature, the reaction between the $Al_3Ti$ and the SiC terminates. The $Ti_3SiC_2$ that has been formed is present as the reaction layer 131 on the surface of the $p^+$ type SiC semiconductor layer 20a.

In order to form the source electrode 30 that is an ohmic electrode having low contact resistance with the surface of the $p^+$ type substrate 20a, it is necessary that the $Al_3Ti$-layer 138 (see FIG. 10) formed during the process of forming the $Ti_3SiC_2$ reaction layer 131 is formed as a uniform layer that makes contact with the $p^+$ type SiC semiconductor layer 20a. It is preferred that the reaction of the Ti-layer 134 and the Al-layer 136 terminates at the point where the period M1 of the step for forming the $Al_3Ti$-layer 138 ends, as shown in FIG. 10, and the $Al_3Ti$-layer 138 is formed as a uniform layer that makes contact with the $p^+$ type SiC semiconductor layer 20a. If the p type SiC semiconductor layer 20a makes contact only with the Al$_3$Ti-layer 138, it is possible to suppress the formation of by-products such as Al$_4$C$_3$, Ti$_5$Si$_3$C$_x$, or TiC, during the step of forming the Ti$_3$SiC$_2$ reaction layer 131. Moreover, if the p$^+$ type SiC semiconductor layer 20a makes contact only with the Al$_3$Ti-layer 138, a small amount of the Al-layer 136 may remain on the Al$_3$Ti-layer 138.

In forming the source electrode 30 of the present embodiment, the step of heating the SiC substrate 11 is divided into two stages, as shown in FIG. 12. i.e. the step of heating the SiC substrate 11 to 700° C. (the step of forming the Al$_3$Ti-layer 138), and the step of heating the SiC substrate 11 to 1000° C. (the step of forming the Ti$_3$SiC$_2$ reaction layer 131). It is thus possible to form the uniform Ti$_3$SiC$_2$ reaction layer 131 and, utilizing this reaction layer 131, it is possible to form the source electrode 30 that is an ohmic electrode having low contact resistance.

In the step of forming the source electrode 30 of the present embodiment, the temperature to which the SiC substrate 11 is heated and the period of heating are set during the step of forming the Ti$_3$SiC$_2$ reaction layer 131 such that the Ti$_3$SiC$_2$ reaction layer 131 is formed with a minimum required thickness (usually 5 nm to 50 nm) across the entirety of an area on which the source electrode 30 is to be formed. The thinner the reaction layer 131 is, the more possible it is to reduce the integrated resistance of the electrode part (i.e. the sum of the contact resistance and the bulk resistance of the electrode). The ohmic electrode formed in the present embodiment achieves good characteristics.

In the present embodiment, the case was described where the temperature of the SiC substrate 11 was maintained at 700° C. for the period M1 in the step of forming the Al$_3$Ti-layer 138. However, the temperature of the SiC substrate 11 need not be maintained at a constant temperature throughout this period. For example, as shown in FIG. 13, the temperature of the SiC substrate 11 may gradually increases from the first temperature to the second temperature during the period M1. The temperature of the SiC substrate 11 is thus between the first temperature and the second temperature during the period M1; and the temperature of the SiC substrate 11 may be set to a temperature that does not increase beyond the second temperature even if the reaction heat caused by the formation of the Al$_3$Ti-layer 138 is applied thereto. The reaction between the Ti of the Ti-layer 134 and the Al of the Al-layer 136 to form the Al$_3$Ti can thus be ended at the point where the period M1 terminates.

Third Embodiment

In the first embodiment and the second embodiment, the case was described where the present invention was applied to a p-channel MOSFET semiconductor device 1. However, the semiconductor devices to which the present invention can be applied are not restricted to p-channel MOSFETs, but can be various types of semiconductor devices. For example, the present invention can also be applied to an n-channel vertical type power MOSFET semiconductor device 202 shown in FIG. 14.

Figure 14:
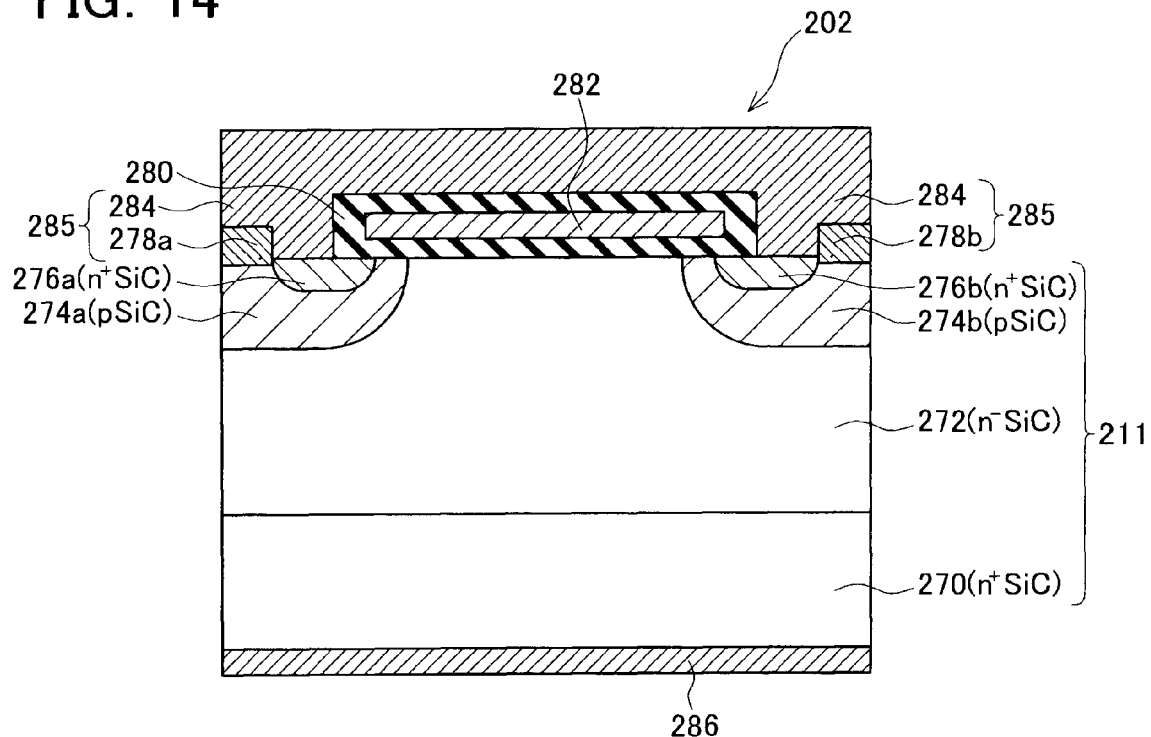
FIG. 14 shows a cross-sectional view of a semiconductor device of a third embodiment.
Figure 15:
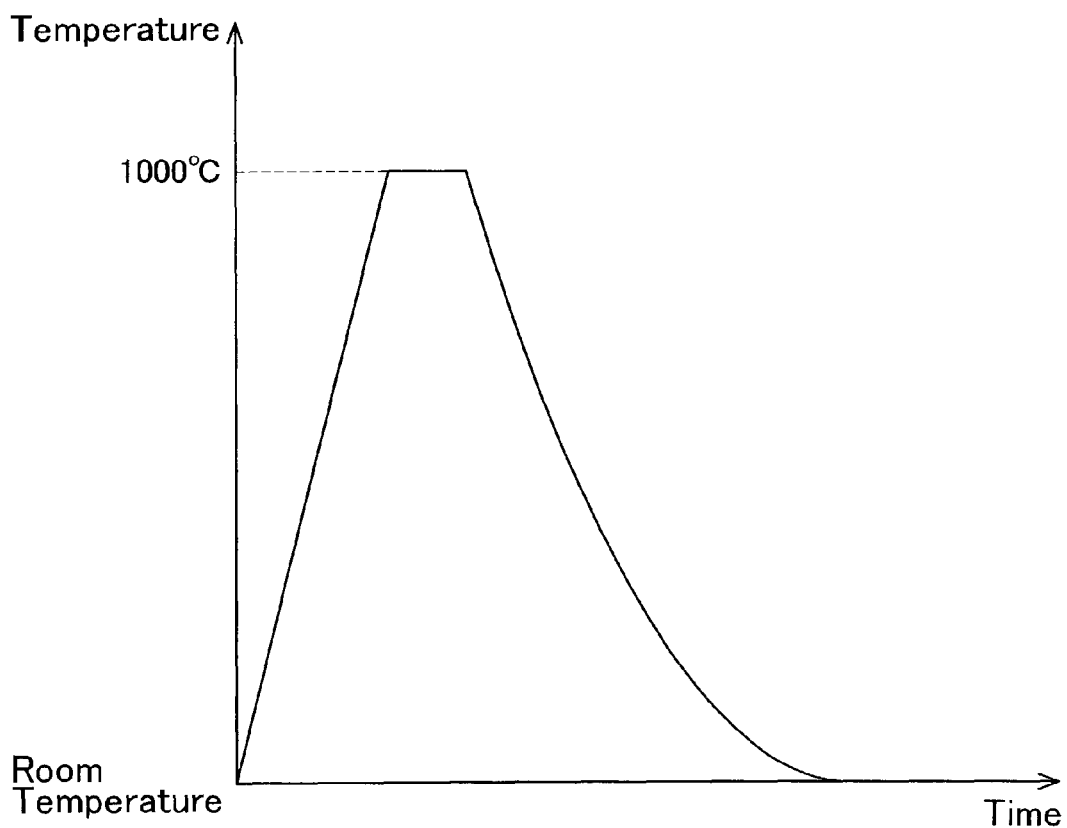
FIG. 15 is a figure describing thermal processing while an electrode is being formed by a conventional technique.

The configuration of the semiconductor device 202 will be described with reference to FIG. 14. The semiconductor device 202 comprises an n-type drift region 272 formed at the upper part of a SiC substrate 211 that comprises an n$^+$ type drain region 270.

The semiconductor device 202 is provided with a pair of p-type body regions 274a and 274b formed at both ends of a surface side of the n-type drift region 272. N$^+$ type source regions 276a and 276b are formed at a region that is a part of a surface side of the p-type body regions 274a and 274b. A reaction layer 278a formed of Ti$_3$SiC$_2$ extends from a left side of a surface of the p-type body region 274a to the n$^+$ type SiC semiconductor layer 276a. The reaction layer 278a is substantially free from by-products such as Al$_4$C$_3$, Ti$_5$Si$_3$C$_x$, or TiC. The reaction layer 278a makes ohmic contact with the p-type body region 274a. Moreover, regions not covered by the reaction layer 278a are present at the p-type body region 274a and the n$^+$ type source region 276a at the center of the semiconductor device 202. Similarly, a reaction layer 278b extends from a right side of a surface of the p-type body region 274b to the n$^+$ type SiC semiconductor layer 276b.

A gate isolating layer 280 extends from the surface of the n$^+$ type source region 276a that is not covered by the reaction layer 278a across the surface of the n$^+$ type source region 276b that is not covered by the reaction layer 278b. The gate isolating layer 280 is formed so as to surround a gate electrode 282.

A surface layer 284 consisting of Ni or Ni/Al is formed so as to cover the reaction layer 278a, the reaction layer 278b, and the gate isolating layer 280. A source electrode 285 that is an ohmic electrode is formed by the reaction layers 278a and 278b and the surface layer 284. An Ni drain electrode 286 is formed on a reverse side of the n$^+$ type drain region 270.

The semiconductor device 202 that has the above configuration is turned on when a predetermined source-drain voltage is applied between the source electrode 285 and the drain electrode 286, and when a predetermined gate voltage is also applied to the gate electrode 282. That is, an n-type channel capable of transporting carriers is formed in regions of the p-type body region 274a and the p-type body region 274b that are facing the gate electrode 282 via the isolating layer 280. Carriers are transported to the n-type drift region 272 via this channel from the n$^+$ type source region 276a and the n$^+$ type source region 276b making contact with source electrode 285. The carriers are transported through the n$^+$ type drain region 270 to the drain electrode 286, whereby current flows between the source electrode 285 and the drain electrode 286, and the semiconductor device 202 is turned on. The channel is extinguished when the voltage applied to the gate electrode 282 becomes less than a gate voltage capable of turning on the semiconductor device 202. Thereupon, carriers are no longer transported between the source electrode 285 and the drain electrode 286, and the semiconductor device 202 is turned off.

The reaction layer 278a and the reaction layer 278b of the semiconductor device 202 can be formed utilizing the manufacturing method described in the first embodiment. Further, the reaction layer 278a and the reaction layer 278b can also be formed utilizing the manufacturing method described in the second embodiment.

Specific examples of the present invention are described above in detail, but these examples are merely illustrative and place no limitation on the scope of the patent claims. The technology described in the patent claims also encompasses various changes and modifications to the specific examples described above.

Furthermore, the technical elements explained in the present specification and drawings provide technical value and utility either independently or through various combinations. The present invention is not limited to the combinations described at the time the claims are filed. In addition, the purpose of the examples illustrated by the present specification and drawings is to satisfy multiple objectives simultaneously, and satisfying any one of those objectives gives technical value and utility to the present invention.

The invention claimed is:

1. A method of manufacturing a semiconductor device comprising a SiC substrate and an electrode formed on the SiC substrate, the method comprising:
   forming a Ti-layer on a surface of the SiC substrate;
   forming an Al-layer on a surface of the Ti-layer;
   maintaining the SiC substrate having the Ti-layer and the Al-layer at a temperature that is higher than or equal to a first temperature which is the minimum temperature of a temperature zone at which the Ti reacts with the Al to form $Al_3Ti$, and lower than a second temperature which is the minimum temperature of a temperature zone at which the $Al_3Ti$ reacts with the SiC to form $Ti_3SiC_2$ until all the Ti in the Ti-layer has reacted with the Al, so that an $Al_3Ti$-layer is formed on the surface of the SiC substrate; and
   further heating the SiC substrate having the $Al_3Ti$-layer to a temperature that is higher than the second temperature so that the SiC substrate reacts with $Al_3Ti$ of the $Al_3Ti$-layer to form a $Ti_3SiC_2$-layer on the surface of the SiC substrate.

2. The method according to claim 1,
   wherein the step of forming the Al-layer is terminated when a thickness of the Al-layer has grown to between 2.84 times and 4 times a thickness of the Ti-layer.

3. The method according to claim 1,
   wherein the step of further heating the SiC substrate having the $Al_3Ti$-layer is terminated when a thickness of the $Ti_3SiC_2$-layer has grown to between 5 nm and 50 nm.

4. The method according to claim 1,
   wherein the step of maintaining the SiC substrate having the Ti-layer and the Al-layer at the temperature between the first and the second temperatures continues longer than or equal to 1 minute.

5. The method according to claim 1,
   wherein the SiC substrate is p-type.

6. A method of manufacturing a semiconductor device comprising a SiC substrate and an electrode formed on the SiC substrate, the method comprising:
   forming a Ti-layer on a surface of the SiC substrate; and
   depositing Al on a surface of the Ti-layer at a predetermined temperature that is higher than or equal to a first temperature which is the minimum temperature of a temperature zone at which Ti reacts with Al to form $Al_3Ti$, and lower than a second temperature which is the minimum temperature of a temperature zone at which $Al_3Ti$ reacts with SiC to form $Ti_3SiC_2$, so that the Ti in the Ti-layer reacts with the deposited Al to form $Al_3Ti$ on the surface of the SiC substrate; wherein condensation heat caused by the deposition of Al and reaction heat caused by the reaction of forming $Al_3Ti$ increase a temperature of the surface of the SiC substrate so that the SiC substrate reacts with $Al_3Ti$ to form a $Ti_3SiC_2$-layer on the surface of the SiC substrate during the step of depositing the Al.

7. The method according to claim 6,
   wherein the step of depositing Al is terminated when a thickness of the $Ti_3SiC_2$-layer has grown to between 2 nm and 30 nm.

8. The method according to claim 6,
   wherein the predetermined temperature is about 850° C.

9. The method according to claim 6,
   wherein the SiC substrate is p-type.

* * * * *